(12) United States Patent
Abhishek et al.

(10) Patent No.: US 9,599,672 B2
(45) Date of Patent: Mar. 21, 2017

(54) INTEGRATED CIRCUIT WITH SCAN CHAIN HAVING DUAL-EDGE TRIGGERED SCANNABLE FLIP FLOPS AND METHOD OF OPERATING THEREOF

(71) Applicant: FREESCALE SEMICONDUCTOR, INC., Austin, TX (US)

(72) Inventors: Kumar Abhishek, Austin, TX (US); Anurag Jindal, Patiala (IN); Nishant Madan, Hisar (IN); Mayank Tutwani, New Delhi (IN)

(73) Assignee: NXP USA, Inc., Austin, TX (US)

( * ) Notice: Subject to any disclaimer, the term of this patent is extended or adjusted under 35 U.S.C. 154(b) by 89 days.

(21) Appl. No.: 14/566,833

(22) Filed: Dec. 11, 2014

(65) Prior Publication Data
US 2016/0169966 A1 Jun. 16, 2016

(51) Int. Cl.
*G01R 31/28* (2006.01)
*G01R 31/3185* (2006.01)

(52) U.S. Cl.
CPC ........... *G01R 31/318552* (2013.01); *G01R 31/318541* (2013.01)

(58) Field of Classification Search
CPC .................................................. G01R 31/3177
See application file for complete search history.

(56) References Cited

U.S. PATENT DOCUMENTS

| | | | |
|---|---|---|---|
| 5,179,295 A | 1/1993 | Mattison | |
| 6,239,640 B1 | 5/2001 | Liao | |
| 6,462,596 B1 | 10/2002 | Varma | |
| 6,938,225 B2 | 8/2005 | Kundu | |
| 7,082,560 B2 | 7/2006 | Parulkar | |
| 2002/0129311 A1* | 9/2002 | Ewen | G01R 31/3187 714/733 |
| 2004/0041610 A1* | 3/2004 | Kundu | G01R 31/318541 327/215 |
| 2005/0097418 A1* | 5/2005 | Anzou | G01R 31/318555 714/733 |
| 2011/0066904 A1* | 3/2011 | Lackey | G01R 31/318594 714/726 |
| 2013/0328704 A1* | 12/2013 | Chen | H03M 9/00 341/101 |
| 2014/0208175 A1* | 7/2014 | Kumar | G01R 31/318536 714/727 |

\* cited by examiner

*Primary Examiner* — April Y Blair
*Assistant Examiner* — Thien D Nguyen

(57) ABSTRACT

An integrated circuit includes a scan chain, a clock divider circuit, and clock selection circuitry. The scan chain includes a plurality of dual edge flip flops, wherein each dual edge flip flop includes a data input, a scan input, a clock input, and data output. The clock divider circuit is coupled to receive a test clock and is configured to divide the test clock to provide a divided test clock. The clock selection circuitry has a first input coupled to receive the divided test clock, a second input coupled to receive a system clock, a control input coupled to receive a scan enable signal, and an output coupled to provide one of the divided test clock and the system clock as a clock signal to the clock inputs of the scan chain based on the scan enable signal.

18 Claims, 8 Drawing Sheets

US 9,599,672 B2

INTEGRATED CIRCUIT WITH SCAN CHAIN HAVING DUAL-EDGE TRIGGERED SCANNABLE FLIP FLOPS AND METHOD OF OPERATING THEREOF

FIELD OF THE INVENTION

An embodiment of the present invention relates to the field of integrated circuit design for test and more particularly, to scan design for dual-edge triggered flip-flops.

BACKGROUND ART

Scan chains including scan elements are frequently included in integrated circuits to provide the capability to control and observe internal states of the integrated circuit during testing or debug, for example.

For an integrated circuit device that implements scan capabilities there are typically two modes: a test mode and a functional mode. In the test mode, the internal state is configured into a scan chain that provides for control and/or observation of internal states. In the functional mode, the integrated circuit device operates according to specification (assuming a properly functioning part).

For a typical scan operation, an integrated circuit device is switched into a test or scan mode and the desired test data is scanned into the scan chain. The integrated circuit device is then switched into a functional mode and one or more functional clocks are applied. The device is then switched back into the scan mode to scan out captured values in order to observe the internal states of the device.

To provide for high observability, it is desirable, to have a scan cell associated with each state element in an integrated circuit.

SUMMARY

The present invention provides an integrated circuit including a scan chain and a method of operating thereof as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF EMBODIMENTS

The present invention will be described with reference to the accompanying drawings. Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

Figure 1:
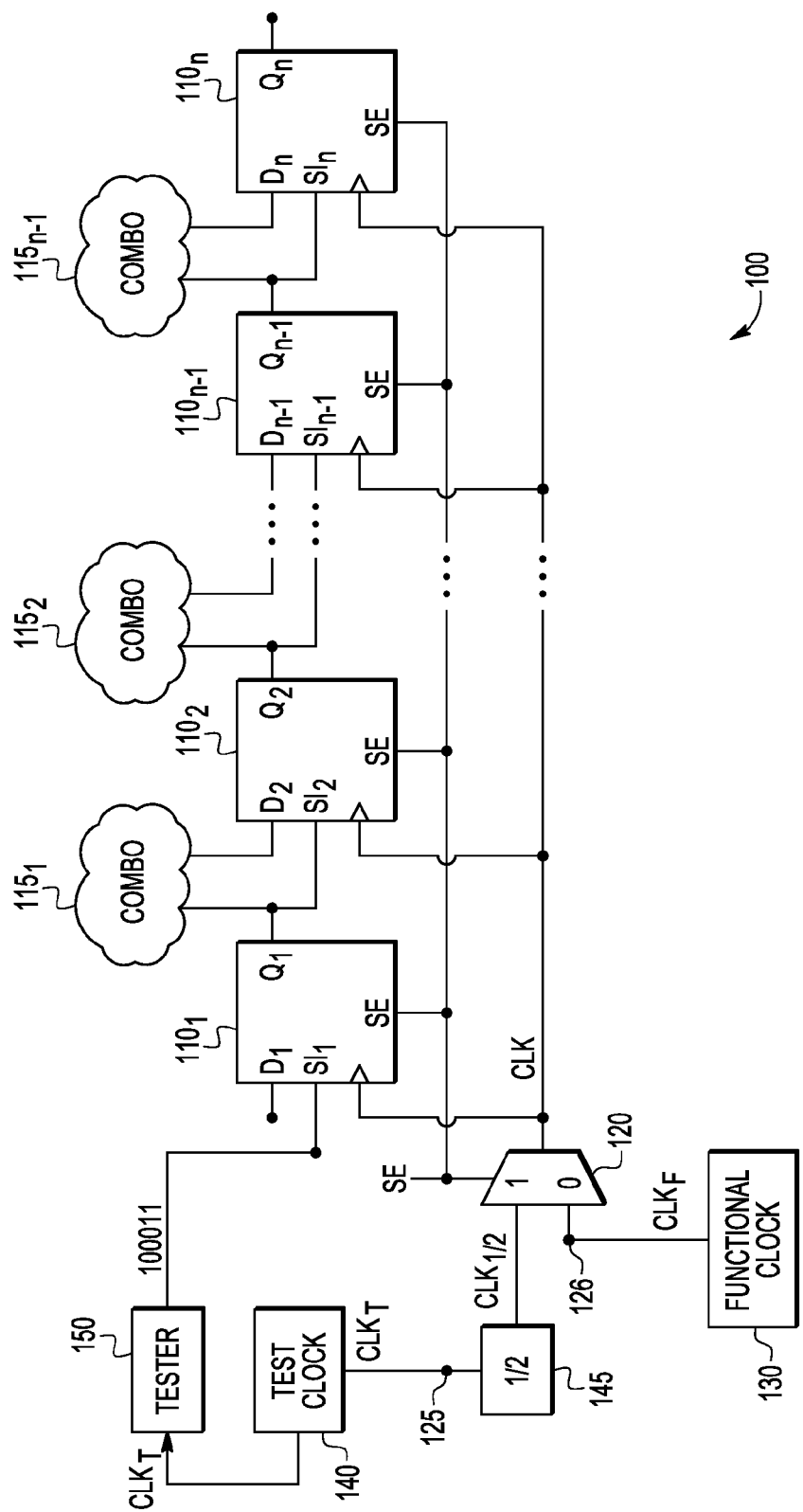
FIG. 1 schematically illustrates a block diagram showing an exemplary scan chain according to an embodiment of the present invention.

Referring first to FIG. 1, a logic block diagram of an exemplary scan chain 100 including one or more dual-edge triggered scannable flip flops 110 is shown. The exemplary scan chain 100 comprises a row of the dual-edge triggered scannable flip flops $110_1$ to $110_n$, which are enabled for dual-edge triggered functionality in functional mode as well as in test mode. The test mode is also designated as scan shift mode. Each of the dual-edge triggered scannable flip flops 110 comprises a data input terminal D for receiving a functional data (D) input signal, a scan in input terminal SI for receiving a scan in data (SI) input signal and an output terminal Q, at which the data captured by the flop-flop is provided. The data provided at the output terminal Q may be either captured functional data or captured scan in data.

The output terminal Q of one dual-edge triggered scannable flip-flop 110 is connected to a combinational logic (combo) 115, an output of which is further connected to a subsequent dual-edge triggered scannable flip-flop 110 of the scan chain 100. The output of the one dual-edge triggered scannable flip-flop 110 is further connected in parallel with the combinational logic (combo) 115 to the scan in input terminal SI of the subsequent dual-edge triggered scannable flip-flop 110.

With reference to the exemplary scan chain 100 of FIG. 1, the output terminal $Q_1$ of the dual-edge triggered scannable flip flop $110_1$ is connected to the data input terminal $D_2$ of the subsequent dual-edge triggered scannable flip flop $110_2$ through the combinational logic $115_1$. The output terminal $Q_1$ of the dual-edge triggered scannable flip flop $110_1$ is also connected in parallel with the combinational logic $115_1$ to the scan in input terminal $SI_2$ of the subsequent dual-edge triggered scannable flip flop $110_2$.

The output terminal $Q_2$ of the dual-edge triggered scannable flip flop $110_2$ is connected to the data input terminal $D_3$ of the subsequent dual-edge triggered scannable flip flop $110_3$ (not shown) through the combinational logic $115_2$. The output terminal $Q_2$ of the dual-edge triggered scannable flip flop $110_2$ is also connected in parallel with the combinational logic 115₂ to the scan in input terminal SI₃ of the subsequent dual-edge triggered scannable flip flop 110₃ (not shown).

The output terminal $Q_{n-1}$ of the dual-edge triggered scannable flip flop $110_{n-1}$ is connected to the data input terminal $D_n$ of the subsequent dual-edge triggered scannable flip flop $110_n$ (not shown) through the combinational logic $115_{n-1}$. The output terminal $Q_{n-1}$ of the dual-edge triggered scannable flip flop $110_{n-1}$ is also connected in parallel with the combinational logic $115_{n-1}$ to the scan in input terminal $SI_n$ of the subsequent dual-edge triggered scannable flip flop $110_n$.

The dual-edge triggered scannable flip flops 110 receive at a scan enable terminal SE a scan enable (SE) select signal, which, for one embodiment, may be provided by a control signal related to a test mode of an integrated circuit that includes scan chain 100. The scan enable (SE) select signal is active high such that the scan in (SI) data input signal is selectively captured by the dual-edge triggered flip-flop 110, when for instance the scan enable (SE) select signal is asserted. When the scan enable (SE) select signal is not asserted, the functional data (D) input signal is selectively captured by the dual-edge triggered flip-flop 110

The dual-edge triggered scannable flip flops 110 receive at a clock input terminal a clock signal Clk, which, for one embodiment, may be provided by a clock selection circuitry of an integrated circuit that includes the scan chain 100. The dual-edge triggered scannable flip-flop 110 captures either the scan in (SI) data provided at the scan in data input terminal SI or the functional data (D) input signal provided at the data input terminal D based on whether the scan enable (SE) select signal is asserted or not. Data is captured at each rising and falling edge of the clock signal Clk. In other words, data is effectively captured twice for each clock cycle.

The clock selection circuitry comprises, for one embodiment, a multiplexer 120 and a clock divider circuit 145. A functional clock signal $Clk_F$ is received at a functional clock ($Clk_F$) terminal, which is connected to one of the input terminals of the multiplexer 120. The clock divider 145 is connected to a test clock ($Clk_T$) terminal, at which test clock signal $Clk_T$ is received. The clock divider 145 is provided to divide an inputted test clock ($Clk_T$) terminal by two. The clock divider 145 provides a clock signal $Clk_{1/2}$ at the output terminal thereof, which is connected to another one of the input terminals of the multiplexer 120. The clock signal $Clk_{1/2}$, has have the frequency of the test clock signal $Clk_T$.

The multiplexer 120 receives the scan enable (SE) select signal, which, for one embodiment, may be provided by a control signal related to a test mode of an integrated circuit that includes the scan chain 100. For the embodiment shown in FIG. 1, the SE signal is active high such that when the SE signal is asserted, the clock signal $Clk_{1/2}$ provided by the clock divider 145 is selectively transmitted to the clock signal terminals of the dual-edge triggered scannable flip flops 110. When the SE signal is not asserted, the functional clock signal $Clk_F$ is selectively transmitted to the clock signal terminals of the dual-edge triggered scannable flip flops 110.

In one embodiment, the test clock signal $Clk_T$ is provided by a test circuitry external to or internal of the integrated circuit comprising the scan chain 100. Further, the functional clock signal $Clk_F$ may be provided by a clock generating circuit such as a PLL (phase-locked loop) circuit, which may be part of the clock selection circuitry or the integrated circuit comprising the scan chain 100. The clock generation circuit may be also arranged external to the clock selection circuitry and/or the integrated circuit comprising the scan chain 100.

The multiplexer 120 may be a 2:1 multiplexer. In particular, the multiplexer 120 may be a mux scan implementation. The clock divider 145 may be a scaler or prescaler circuit.

The scan in (SI) data may is generated and provided by a scan in (SI) data generation circuit, which may be part of the test circuitry. In particular, the test circuitry comprises the scan in (SI) data generation circuit and a test clock signal $Clk_T$ generating circuit such as a PLL circuit and provided the scan enable (SE) select signal or the control signal related to a test mode of an integrated circuit that includes scan chain 100.

Figure 2:
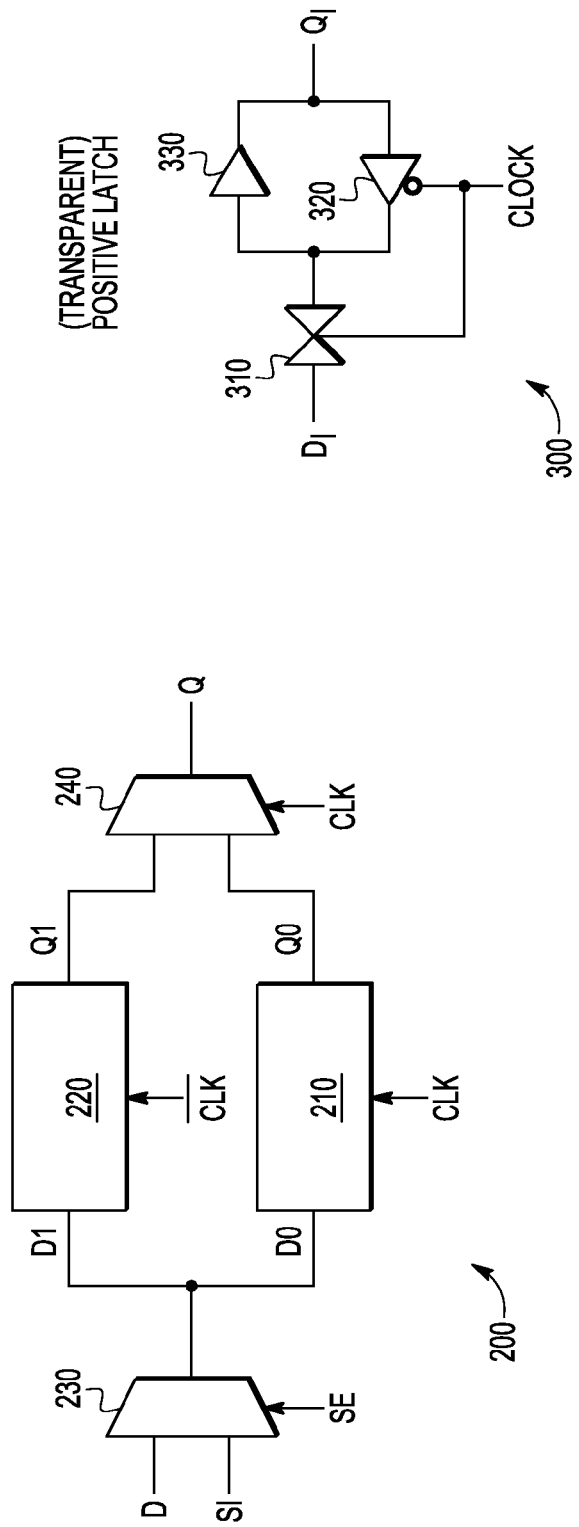
FIG. 2 schematically illustrates a block diagram of a dual-edge triggered scannable Flip-Flop usable in the exemplary scan chain of FIG. 1.

Referring now to FIG. 2, a logic block diagram of an exemplary dual-edge triggered scannable flip flop 200 applicable for implementing the scan chain described with reference to FIG. 1 is shown. The scan flip flop 200 of FIG. 2 comprises multiplexer or mux scan implementation in order to operate in a test mode or a functional mode.

The dual-edge triggered scannable flip flop 200 includes the multiplexers 230 and 240 and latch elements 210 and 220. The mux 230 receives a scan enable (SE) select signal, which, for one embodiment, may be provided by a control signal related to a test mode of an integrated circuit that includes one or more of the dual-edge triggered scannable flip flops 200. For the embodiment shown in FIG. 2, the SE signal is active high such that when the SE signal is asserted, the scan in (SI) data input signal is selectively transmitted to the latches 210 and 220 and when the SE signal is not asserted, the functional data (D) input signal is selectively transmitted to the latches 210 and 220.

Thus, in a test mode, for example, when the SE signal is asserted, the SI data input signal is provided to the latches 210 and 220. The latch 210 receives a clock signal Clk, while the latch 220 receives a complement $\overline{Clk}$ of the clock signal. As the Clk signal transitions high, the state of the SI signal is captured at the latch 210 and the state captured by the latch 220 is provided at an output thereof to an output node Q of the dual-edge triggered scannable flip flop 200. Then, as the Clk signal transitions low, the state of the SI signal is captured at the latch 220 and a state previously captured by the latch 210 is provided at the output node Q of the dual-edge triggered scannable flip flop 200.

For a functional mode, where the SE signal is low for the embodiment shown, the functional data input stream (D) is instead provided to the latches 210 and 220. Otherwise, the operation of the dual-edge triggered scannable flip flop 200 is the same as that described for the test mode. In the manner described above, the dual-edge triggered scannable flip flop 200 provides a mux scan approach that may be used where the performance penalty incurred by the multiplexer 230 is not problematic. For the dual-edge triggered scannable flip flop 200, even in the test mode, data is provided at each edge of the clock signal Clk such that the power dissipation may be higher in a test mode, but the data capture rate during a scan mode is also higher. Thus, various embodiments of a dual-edge triggered scannable flip flop and implementations using a dual-edge triggered scannable flip flop have been described. The dual-edge triggered scannable flip flops of various embodiments provide observability and controllability for dual-edge triggered flip-flop elements where scan capabilities are desired.

The latches 210 and 220 may implemented as illustratively shown in FIG. 2 with respect to the example latch 300, which is edge-triggered transparent latch and composed of inter alia transmission gate 310, a three-state logic buffer 320 and a buffer 330. When the clock signal (Clock) supplied to the example latch 300 is high, the transmission gate 310 is enabled, the three-state logic buffer 320 is disabled and the buffer 330 provides the state of the input signal $D_I$ as output signal $Q_I$; this first mode of operation of the exemplary latch 300 may be also designated as transparent mode or capture mode.

When the clock signal (Clock) supplied to the example latch 300 is low, the transmission gate 310 is disabled and the three-state logic buffer 330 is enabled, which maintains the state of the buffer 320 in the same state as long as clock signal (Clock) is low; this second mode of operation of the exemplary latch 300 may be also designated as latch mode. The buffer 330 provides the state of the input signal $D_I$ as output signal $Q_I$.

The using the exemplary latch 300 in the circuit of the dual-edge triggered scannable flip flop 200 for at least one of the latches 210 and 220, the mux 240 is operated to control which one of the latches 210 and 220 actively drives the signal output Q. In particular, the latch output signal Q0 of the latch 210 is transmitted by the mux 240 to the output node Q of the dual-edge triggered scannable flip flop 200 when the latch 210 is in latch mode. Further, the latch output signal Q1 of the latch 220 is transmitted by the mux 240 to the output node Q of the dual-edge triggered scannable flip flop 200 when the latch 220 is in latch mode.

Figure 3:
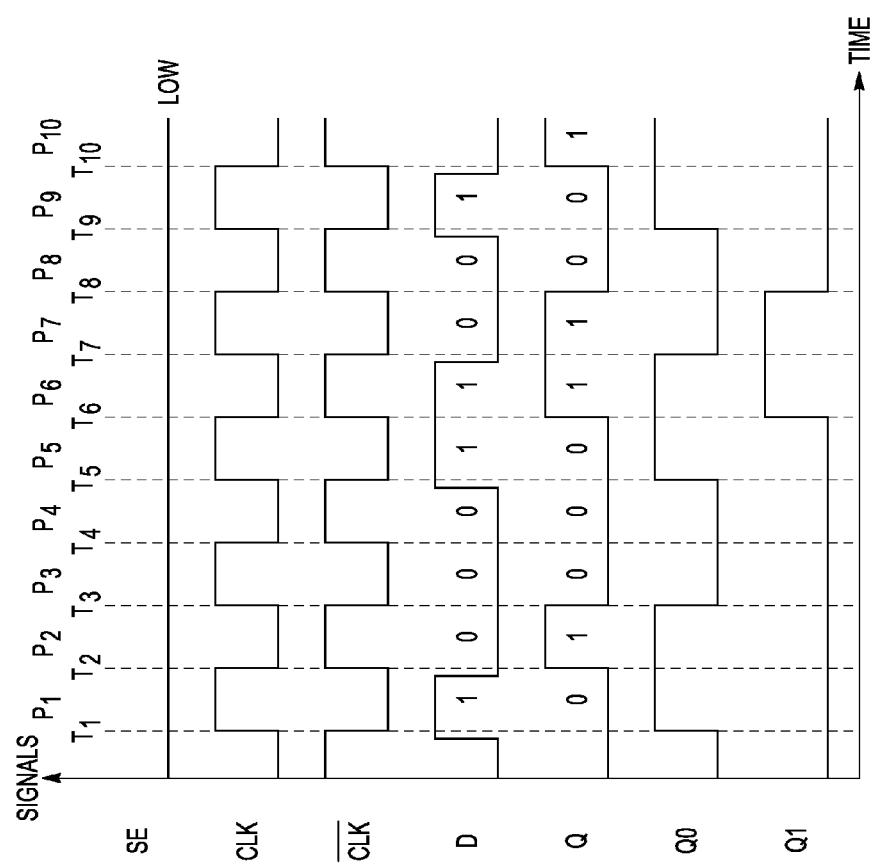
FIG. 3 schematically illustrates a timing diagram of the function of the exemplary dual-edge triggered scannable Flip-Flop.

Referring now to FIG. 3, a timing diagram schematically illustrating the function of the exemplary dual-edge triggered scannable flip flop 200 of FIG. 2 is shown. The function of the exemplary dual-edge triggered scannable flip flop 200 will be explained with reference to the signal waveforms at selected terminals and outputs correspondingly labeled in FIG. 2. The clock signal, the complement clock signal $\overline{Clk}$, the functional data input signal at the data input terminal D and the output signal at the data output terminal Q along with the output signals Q0 and Q1 of the latches 210 and 220 are illustrated.

When the clock signal Clk is high (the complement clock signal $\overline{Clk}$ is low), the latch 210 is in capture mode and the latch 220 is in latch mode. When the clock signal Clk is low (the complement clock signal $\overline{Clk}$ is high), the latch 210 is in latch mode and the latch 220 is in capture mode.

An exemplary functional data input signal stream "1 0 0 0 1 1 0 0 1 0" is supplied to the data input terminal D The level of the clock Clk changes from low level to high level at T1 and maintains at high level during the period P1. The transition of the clock level switches the latch 210 in capture mode and the latch 220 in latch mode. Accordingly, the data input D signal, which is high during period P1, is captured by latch 210. The output signal Q is driven by the latch 220 being in latch mode. In the illustrated example, the latch 220 stores a low level signal, which may be considered as default reset state. Accordingly, the low level signal maintained by the latch 220 is presented at the signal output terminal Q. The states of the latch 210 in capture mode and the latch 220 in latch mode is schematically shown with respect to the signals Q0 and Q1 in FIG. 3. The state of the latch 210 changes from low level to high level in period P1 in accordance with the data input D signal.

The level of the clock Clk changes from high level to low level at T2 and maintains at low level during the period P2. The transition of the clock level switches the latch 210 in latch mode and the latch 220 in capture mode. Accordingly, the data input D signal, which is low during period P2, is captured by latch 220. The output signal Q is driven by the latch 210 being in latch mode. In the illustrated example, the latch 210 stores a high level signal captured during the previous period P1; cf. signal Q0. Accordingly, the high level signal maintained by the latch 210 is presented at the signal output terminal Q. The state of the latch 220 remains at low level in period P2 in accordance with the data input D signal; cf. signal Q1.

The level of the clock Clk changes from low level to high level at T3 and maintains at high level during the period P3. The transition of the clock level switches the latch 210 in capture mode and the latch 220 in latch mode. Accordingly, the data input D signal, which is low during period P3, is captured by latch 210. The output signal Q is driven by the latch 220 being in latch mode. In the illustrated example, the latch 220 stores a low level signal captured during the previous period P2; cf. signal Q1. Accordingly, the low level signal maintained by the latch 220 is presented at the signal output terminal Q. The state of the latch 210 changes from high level to low level in period P3 in accordance with the data input D signal; cf. signal Q0.

The level of the clock Clk changes from high level to low level at T4 and maintains at low level during the period P4. The transition of the clock level switches the latch 210 in latch mode and the latch 220 in capture mode. Accordingly, the data input D signal, which is low during period P4, is captured by latch 220. The output signal Q is driven by the latch 210 being in latch mode. In the illustrated example, the latch 210 stores a low level signal captured during the previous period P3; cf. signal Q0. Accordingly, the low level signal maintained by the latch 210 is presented at the signal output terminal Q. The state of the latch 220 remains at low level in period P4 in accordance with the data input D signal; cf. signal Q1.

The level of the clock Clk changes from low level to high level at T5 and maintains at high level during the period P5. The transition of the clock level switches the latch 210 in capture mode and the latch 220 in latch mode. Accordingly, the data input D signal, which is high during period P5, is captured by latch 210. The output signal Q is driven by the latch 220 being in latch mode. In the illustrated example, the latch 220 stores a low level signal captured during the previous period P4; cf. signal Q1. Accordingly, the low level signal maintained by the latch 220 is presented at the signal output terminal Q. The state of the latch 210 changes from low level to high level in period P3 in accordance with the data input D signal; cf. signal Q0.

The level of the clock Clk changes from high level to low level at T6 and maintains at low level during the period P6. The transition of the clock level switches the latch 210 in latch mode and the latch 220 in capture mode. Accordingly, the data input D signal, which is high during period P6, is captured by latch 220. The output signal Q is driven by the latch 210 being in latch mode. In the illustrated example, the latch 210 stores a high level signal captured during the previous period P5; cf. signal Q0. Accordingly, the high level signal maintained by the latch 210 is presented at the signal output terminal Q. The state of the latch 220 changes from low level to high level in period P4 in accordance with the data input D signal; cf. signal Q1.

The level of the clock Clk changes from low level to high level at T7 and maintains at high level during the period P7. The transition of the clock level switches the latch 210 in capture mode and the latch 220 in latch mode. Accordingly, the data input D signal, which is low during period P7, is captured by latch 210. The output signal Q is driven by the latch 220 being in latch mode. In the illustrated example, the latch 220 stores a high level signal captured during the previous period P6; cf. signal Q1. Accordingly, the high level signal maintained by the latch 220 is presented at the signal output terminal Q. The state of the latch 210 changes from high level to low level in period P7 in accordance with the data input D signal; cf. signal Q0.

The level of the clock Clk changes from high level to low level at T8 and maintains at low level during the period P8. The transition of the clock level switches the latch 210 in latch mode and the latch 220 in capture mode. Accordingly, the data input D signal, which is low during period P8, is captured by latch 220. The output signal Q is driven by the latch 210 being in latch mode. In the illustrated example, the latch 210 stores a low level signal captured during the previous period P7; cf. signal Q0. Accordingly, the low level signal maintained by the latch 210 is presented at the signal output terminal Q. The state of the latch 220 changes from high level to low level in period P4 in accordance with the data input D signal; cf. signal Q1.

The level of the clock Clk changes from low level to high level at T9 and maintains at high level during the period P9. The transition of the clock level switches the latch 210 in capture mode and the latch 220 in latch mode. Accordingly, the data input D signal, which is high during period P9, is captured by latch 210. The output signal Q is driven by the latch 220 being in latch mode. In the illustrated example, the latch 220 stores a low level signal captured during the previous period P8; cf. signal Q1. Accordingly, the low level signal maintained by the latch 220 is presented at the signal output terminal Q. The state of the latch 210 changes from low level to high level in period P7 in accordance with the data input D signal; cf. signal Q0.

The level of the clock Clk changes from high level to low level at T10 and maintains at low level during the period P10. The transition of the clock level switches the latch 210 in latch mode and the latch 220 in capture mode. Accordingly, the data input D signal, which is low during period P10, is captured by latch 220. The output signal Q is driven by the latch 210 being in latch mode. In the illustrated example, the latch 210 stores a high level signal captured during the previous period P9; cf. signal Q0. Accordingly, the low level signal maintained by the latch 210 is presented at the signal output terminal Q. The state of the latch 220 remains at low level in period P10 in accordance with the data input D signal; cf. signal Q1.

During the odd numbered periods $P_{2i+1}$, when the clock is high, the latch 210 in capture mode captures the input data D and the latch 220 in latch mode drives the output signal of the dual-edge triggered scannable flip flop. During the even numbered periods $P_{2i}$, when the clock is low, the latch 210 in latch mode drives the output signal and the latch 220 in latch mode captures the input data D of the dual-edge triggered scannable flip flop.

As shown in the timing diagram of FIG. 3, the dual-edge triggered scannable flip flop has an output that is synchronized to the clock signal and each transition in the data input signal is latched on both edges of the clock signal.

Although not shown in FIG. 3, those skilled in the art immediately understand that each transition of the scan in data signal supplied to the dual-edge triggered scannable flip flop is likewise latched on both edges of the clock signal and the captured scan in data is presented at the output Q synchronized to the clock signal.

Figure 4:
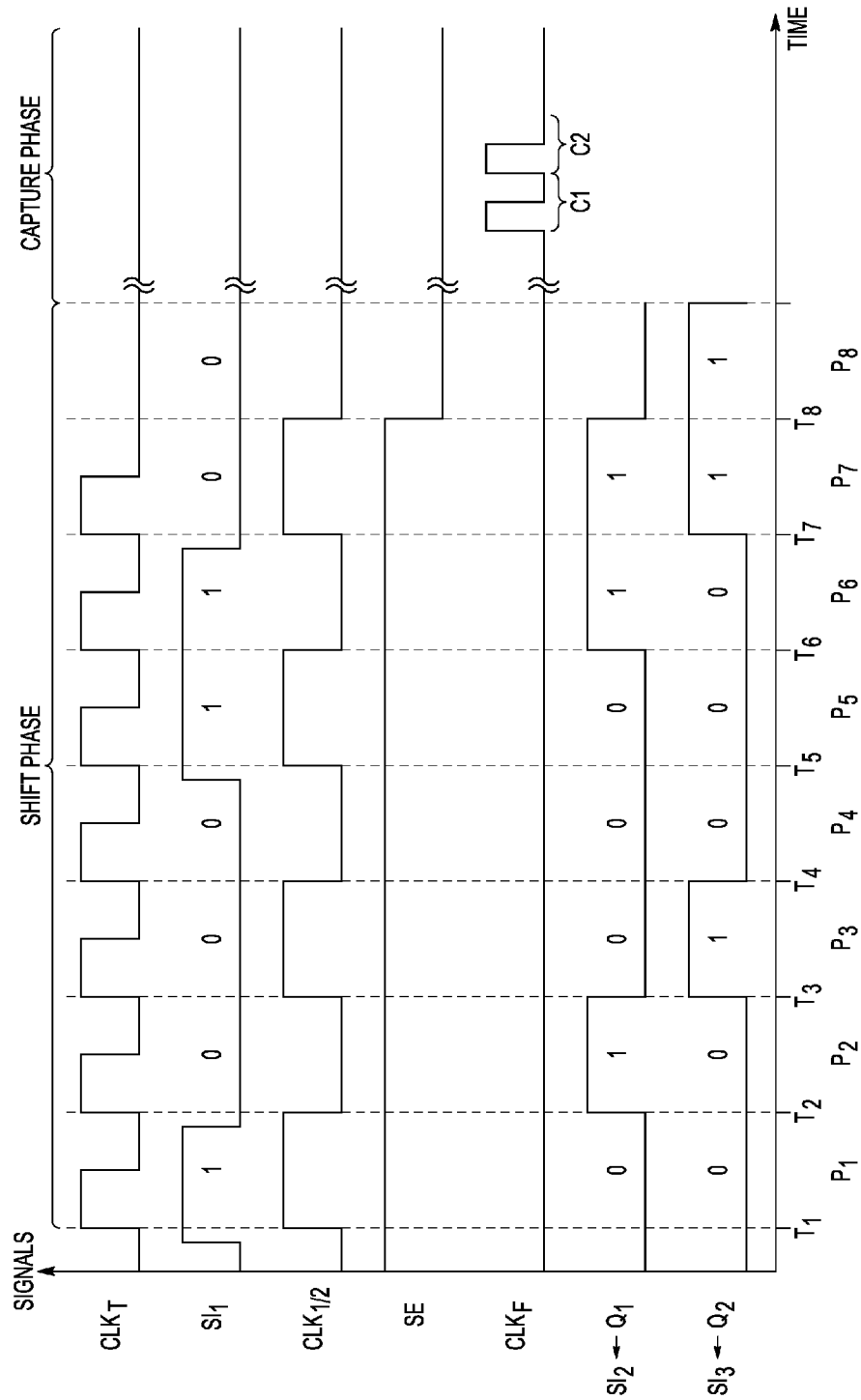
FIG. 4 schematically illustrates a timing diagram of the function of the exemplary scan chain of FIG. 1.

Referring now to FIG. 4, a timing diagram schematically illustrating the function of the exemplary scan chain 100 of FIG. 1 is shown. On the basis of the above description, the function of the exemplary scan chain 100 comprising several dual-edge triggered scannable flip flops $110_1$ to $110_n$ will be explained with reference to the signal waveforms at selected terminals and outputs correspondingly labeled in FIG. 4.

During a shift phase, the scan enable (SE) select signal is asserted. An exemplary scan in data (SI) signal stream of test pattern "1 0 0 0 1 1 0", which is generated at a tester 150 or tester module in accordance with a test clock signal $Clk_T$, is shifted into the scan chain 100. Each individual signal of the scan in data (SI) signal stream has a duration of one period of the test clock signal $Clk_T$. The periods $T_1$ to $T_8$ indicated in the timing diagram correspond to one period of the test clock signal $Clk_T$.

In accordance with the asserted scan enable (SE) select signal (an active high signal), the clock signal Clk, which is transmitted by the multiplexer 120 to the dual-edge triggered scannable flip-flops 110 is the clock signal $Clk_{1/2}$ generated by the signal frequency divider 145, to which the test clock signal $Clk_T$ is supplied. The signal frequency divider 145 may be also referred to as clock divider 145.

The clock signal $Clk_{1/2}$ supplied to the dual-edge triggered scannable flip-flops 110 is shown accordingly in FIG. 4. During the shift phase, the functional clock signal $Clk_F$ may be switched off to reduce power consumption and signal interference.

In a typical scan application the test pattern generated by a tester 150 is sequentially and clock-synchronously scanned into the scan chain via the scan in data input terminal SI of the first dual-edge triggered scannable flip flop 110; into the scan chain 100. The test pattern generated by a tester 150 is clock-synchronous with the test clock signal $Clk_T$. In other words, the test pattern generated by the tester 150 requires a scannable flip-flops with single-edge triggered capturing capabilities in test mode. In that the signal frequency divider 145 is intercoupled between test clock signal generating circuit 140 and the dual-edge triggered scannable flip flops 110, the scan chain 100 operates like a scan chain comprising single-edge triggered scannable flip flops form point of view of the tester 150.

Each individual scan and shift operation of the scan chain 100 is operated at the period of the test clock signal $Clk_T$ although the scan chain 100 is clocked by the test clock signal $Clk_2$ at half the frequency of the test clock signal $Clk_T$.

The individual scan and shift operations may be further understood from FIG. 4, which schematically depicts the signal waveforms presented at the signal output terminal $Q_1$ of the first dual-edge triggered scannable flip flop $110_1$ and the signal output terminal $Q_2$ of the second dual-edge triggered scannable flip flop $110_2$.

The scan in data (SI) signal applied to the scan in data input terminal $SI_1$ of the first dual-edge triggered scannable flip flop $110_1$ during the period $P_1$ is presented as the output $Q_1$ thereof after one full clock cycle of the test clock signal, during period $P_2$, from the tester's point of view.

From the scan chain's point of view, the scan in data (SI) signal applied to the scan in data input terminal $SI_1$ of the first dual-edge triggered scannable flip flop $110_1$ during the period $P_1$ is presented as the output $Q_1$ thereof after one half clock cycle of the clock signal Clk supplied to the dual-edge triggered scannable flip flops 110.

After the desired test pattern is completely shifted into the scan chain 100, the scan chain may be transitioned into functional mode in response to a transition of the scan enable (SE) select signal to not asserted such that one or more cycles of the functional clock signal may be applied to the scan chain 100 as indicated with reference to the clock signal $Clk_F$ in FIG. 4. The scan chain 100 may then be transitioned back into the test mode or scan and shift mode in response to a transition of the scan enable (SE) select signal, such that data from the dual-edge triggered scannable flip flops 110 may be scanned/shifted out to observe the states of the corresponding state elements in the combinational logic 115.

The output signal presented at the output terminals Q of the dual-edge triggered scannable flip-flops is delayed with respect to the respective triggering edge of the clock signal due to signal propagation time. The delay is short in relationship to the half period of the clock signal $Clk_{1/2}$.

Figure 5:
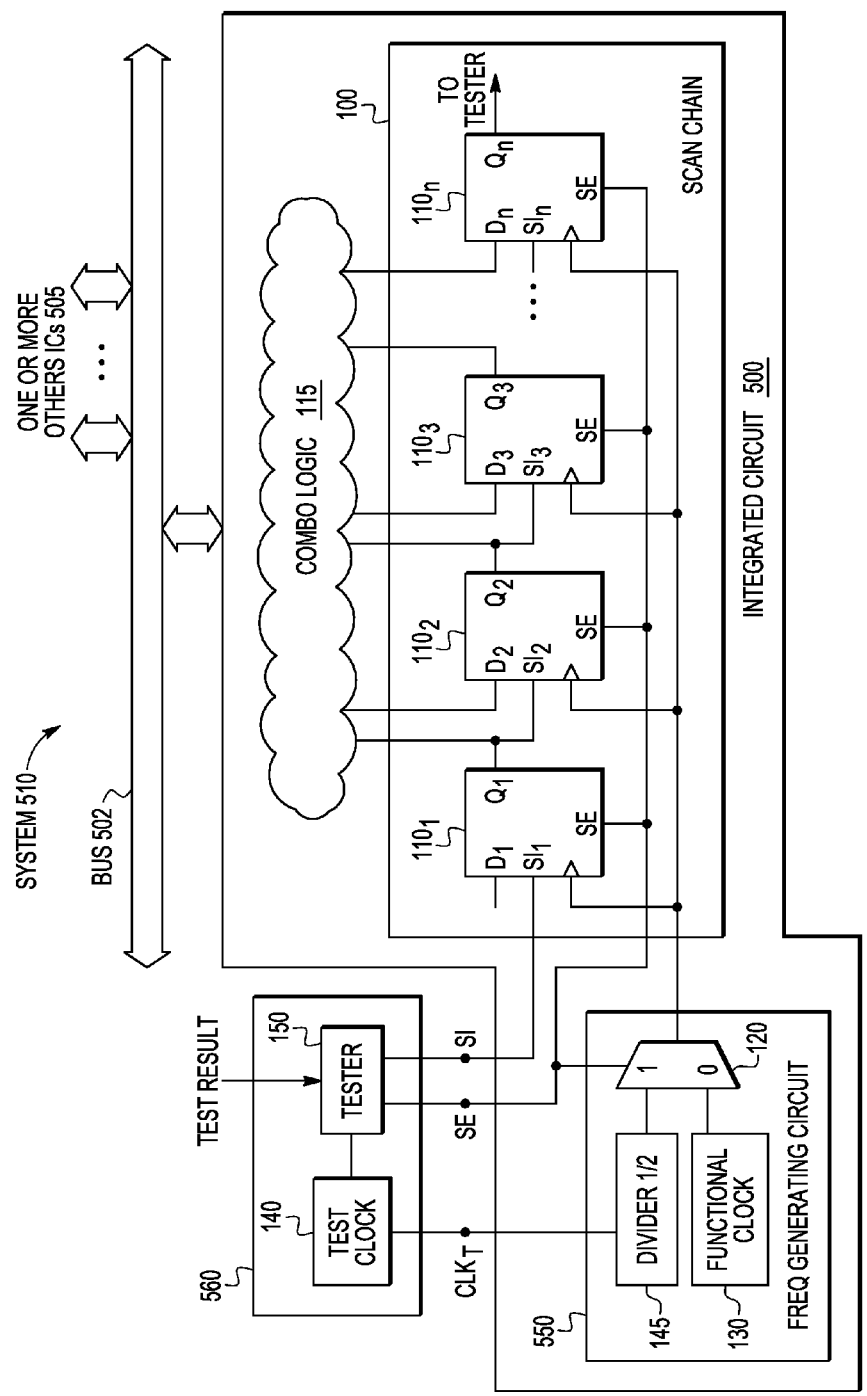
FIG. 5 schematically illustrates a block diagram of a system including an integrated circuit with a scan chain including several dual-edge triggered flip-flops according to an embodiment of the present invention.

Referring now to FIG. 5, a schematic block diagram of an exemplary integrated circuit that includes a scan chain 100 is shown.

The integrated circuit 500 may be implemented in or part of a system 510 and coupled to a bus 502 and to one or more other integrated circuits (ICs) 505 in the system 510 via the bus 502. The integrated circuit 500 may be a microprocessor, for example. Alternatively, the integrated circuit 500 may be any other type of integrated circuit for which it is desirable to use one or more dual-edge triggered flip-flops and for which scan capabilities for the dual-edge triggered flip-flops are desired. The other integrated circuits 505 may include one or more input devices through which a user may control the mode of the integrated circuit 500, provide test data or otherwise control the integrated circuit 500 during a debug or testing operation. The other integrated circuits 505 may also include one or more output devices that may be capable of enabling a user to observe results of testing or debugging operations including data that is scanned out of the scan flip flops 110 in the scan chain 100.

In the one illustrated embodiment, the scan chain 100 and the clock selection circuitry 550 may be comprises by the integrated circuit 500. The clock selection circuitry 550 comprises the multiplexer 120 and a signal frequency divider 145. In an optional embodiment, the clock selection circuitry 550 may further comprise the circuit for generating the functional clock 130.

The test clock signal $Clk_T$ and the test pattern (a stream of individual scan in (SI) data signals) may be provided by a test circuitry 560, which may be external to but also part of the integrated circuit 500.

The test circuitry 560 may comprise a clock generating circuit 140, which is configured to generate the test clock signal $Clk_T$, and a tester or tester module 150, which generates the test pattern in accordance with the test clock signal $Clk_T$. The tester 150 may include one or more predefined test patterns.

The test clock signal $Clk_T$ is supplied to the signal frequency divider 145 of the clock selection circuitry 550 and the test pattern is supplied to the scan in data (SI) input terminal $SI_1$ of the first dual-edge triggered scannable flip-flop $110_1$ of the scan chain 100.

The scan enable (SE) select signal may be also provided by the tester 150 and supplied to the multiplexer 120 of the clock selection circuitry 550 and the dual-edge triggered scannable flip-flops 110 of the scan chain 100.

The stream of output signals obtainable from the last dual-edge triggered scannable flip-flop 110n by repeatedly shifting the data in the scan chain 100 may be supplied to the tester 150 for being stored and/or analyzed at the tester 150.

Figure 6:
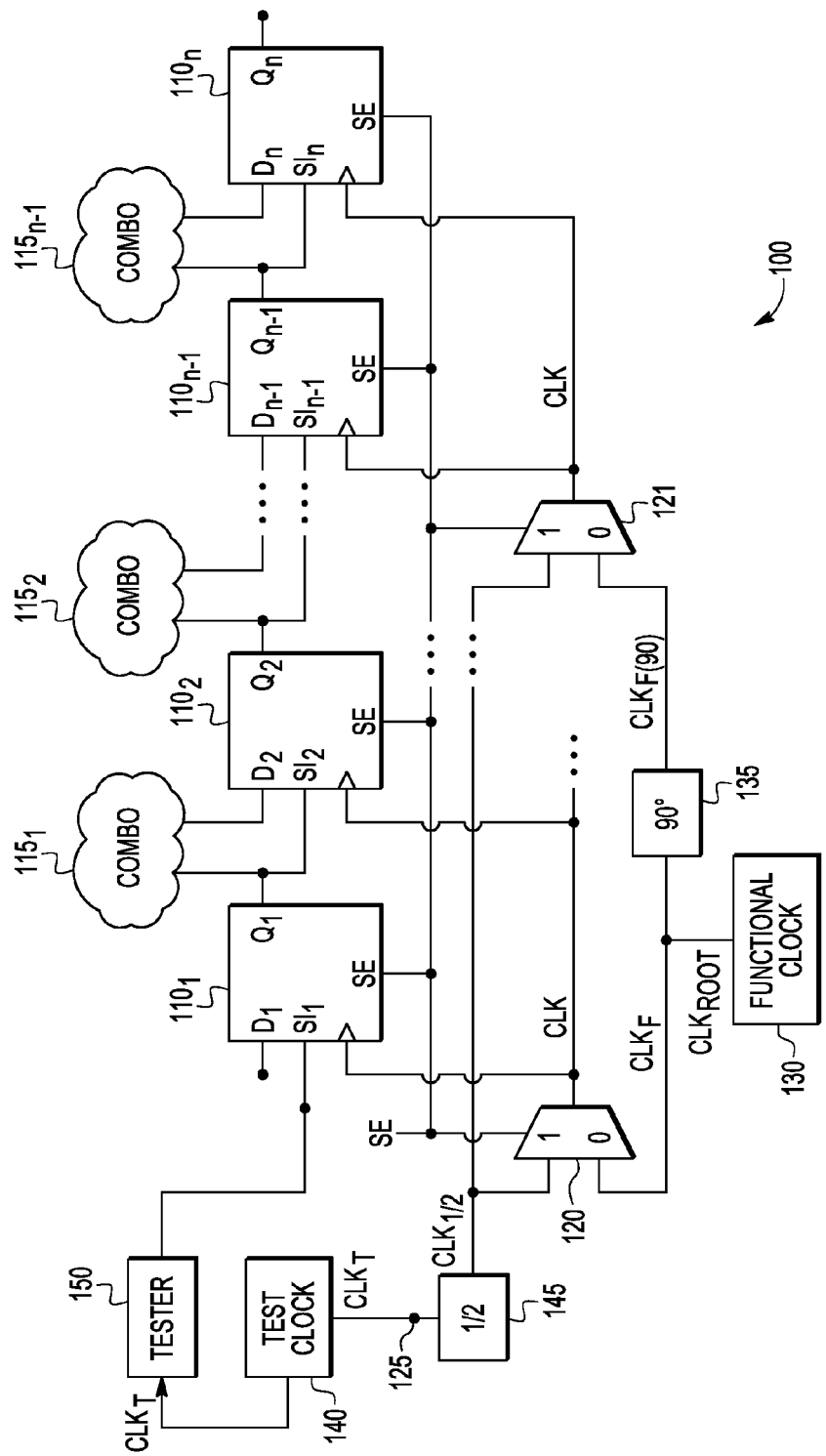
FIG. 6 schematically illustrates a block diagram showing an exemplary scan chain according to another embodiment of the present invention.

Referring now to FIG. 6, a logic block diagram of another exemplary scan chain 100 including one or more dual-edge triggered scannable flip flops is shown.

Figure 7:
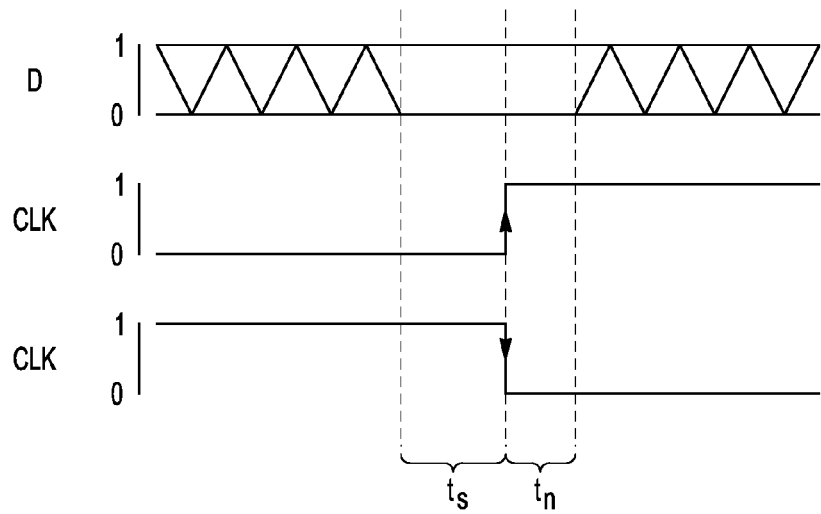
FIG. 7 schematically illustrates a timing diagram showing definitions for timing constraints in a flip-flop in accordance with an exemplary embodiment of the present invention.

To ensure that a data signal is captured accurately by a flip flop, the data signal must be stable for a time ts (set up time) before the triggering edge, and kept constant for a time th (hold time) after the triggering edge as illustrated in FIG. 7 with respect to a raising edge of a clock signal as well as a falling edge of a clock signal in accordance with dual-edge triggering functionality of the flip flops 110. The output of the dual-edge triggered scannable flip-flops changes when triggered by the edges of the clock pulse, so changes to the logic signals throughout the circuit all begin at the same time synchronized by the clock. The outputs of all the flip flops in a circuit may be called the state of a so-called synchronous circuit. The state of the synchronous circuit changes on the basis of the clock pulses. The changes in signal require a certain amount of time to propagate through the combinational logic of the circuit. This is called propagation delay. The period of the clock signal should be made long enough so the output of all the logic gates of the combinational logic have time to settle to stable signals before the next triggering edge of the clock pulse. As long as this condition is met, synchronous circuits will operate stably. According to an embodiment of the present invention, the flip flips 110 are dual-edge triggered. Hence, the propagation delay through the combinational logic circuitries 115 interposed between dual-edge triggered flip flops receiving the same clock signal has to meet the boundary condition to settle to stable output signals within less than approximately half clock cycle, in particular less than half clock cycle minus the set up time ts. For instance, the combinational logic circuitries $115_1$ and $115_{n-1}$ have a signal propagation delay meeting the above requirement of a maximum propagation delay of a half clock cycle (minus the set up time ts). The combinational logic circuitries $115_1$ and $115_{n-1}$ may be designated as full cycle signal paths.

The exemplary embodiment of a scan chain shown in FIG. 6 substantially corresponds to the exemplary embodiment of a scan chain shown in FIG. 1 except that the dual-edge triggered scannable flip-flops 110 of the scan chain 100 comprises at least two groups of dual-edge triggered scannable flip-flops 110. For the sake of illustration, two groups of dual-edge triggered scannable flip-flops 110 are shown: the first group comprises the dual-edge triggered scannable flip-flops $110_1$ to $110_{n-2}$ and the second group comprises $110_{n-1}$ and $110_n$.

Each of the group of dual-edge triggered scannable flip-flops 110 is selectively supplied with a separate functional clock signals $Clk_F$ and $Clf_{F(90)}$. The separate functional clock signals $Clk_F$ and $Clf_{F(90)}$ are derived from a common root clock signal $Clk_{root}$, which is identical with the functional clock signals $Clk_F$. The functional clock signal $Clf_F$ (90) is obtained from the root clock signal $Clk_{root}$ with the help of a phase shifter 135, which outputs the functional clock signal $Clf_{F(90)}$. For the sake of illustration, the phase shifter 135 is provided to shift the phase of the input clock signal by 90°.

For instance in order to compensate for a longer signal propagation delays through the combinational logic, e.g. the combinational logic $115_{n-2}$, the phase of the clock signal supplied to the second group of dual-edge triggered scannable flip-flops $110_{n-1}$ and $110_n$ shifted. The phase shift may be in a range of 0° to 90° in particular the maximum phase shift is 90°. A phase shift of 90° allows for a maximum propagation delay of the combinational logic $115_{n-2}$ of approximately a full clock cycle, in particular a full clock cycle minus the set up time ts. The combinational logic $115_{n-2}$ may be designated as full cycle signal path. The phase shifter 135 shifting the phase of the clock signal provided to the second group of flip flops in relationship to the clock signal provided to the first group of flip flops allows to adjust the maximum allowed propagation delay through the combinational logic arranged between the first group and the second group.

A multiplexer 120, 121 is interposed within each clock signal path to the two groups of dual-edge triggered scannable flip-flops, which enables to selectively switch between the respective functional clock signal $Clk_F$ or $Clk_{F(90)}$ and the frequency divided test clock signal $Clk_{1/2}$ based on the scan enable (SE) select signal.

Figure 8:
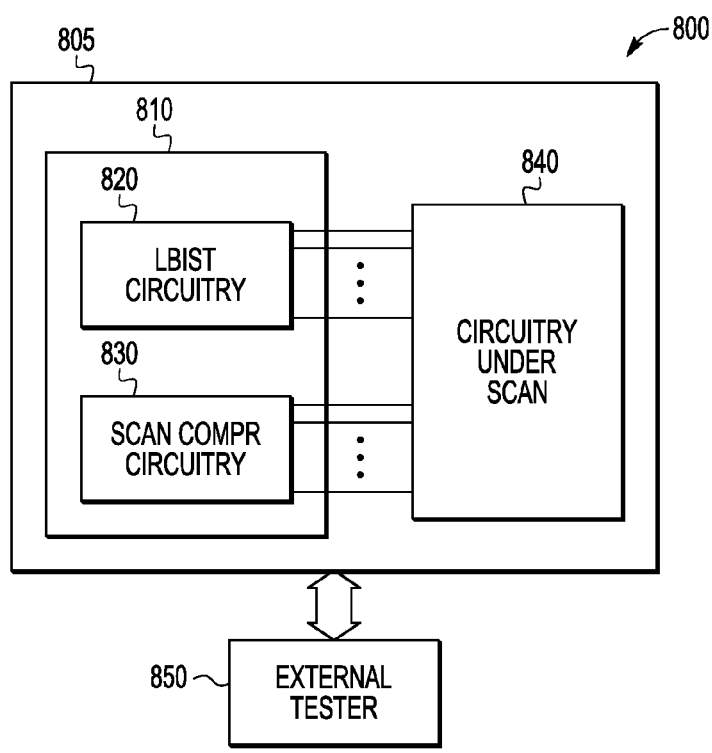
FIG. 8 schematically illustrates a block diagram showing an exemplary integrated circuit testing system comprising an integrated circuit (IC) that includes scan test circuitry and circuitry under test in an illustrative embodiment according to the present invention.

FIG. 8 shows an embodiment of a testing system 800, which comprises a tester 850 and an integrated circuit (IC) under test 805. The integrated circuit 800 comprises scan test circuitry 810 coupled to an internal circuitry 840 that is subject to testing utilizing the scan test circuitry 810. The tester 850 in the exemplary embodiment is an external tester relative to the integrated circuit 805, but in other embodiments may be at least partially incorporated into the integrated circuit 805.

The scan test circuitry 810 of the integrated circuit 805 in the illustrated embodiment comprises e.g. a LBIST circuitry 820 and scan compression circuitry 830, both of which are coupled to the circuitry under test 840. In other embodiments, the scan test circuitry 810 may comprise either LBIST circuitry 820 or scan compression circuitry 830, but not both as in the illustrated embodiment. Some embodiments of the present invention may therefore be configured to utilize compressed or non-compressed scan testing, and other embodiments of the invention are not limited in this regard.

The LBIST circuitry 820 will be described in greater detail below in conjunction with FIG. 9, and comprises a plurality of scan chains. Each of the individual scan chains is configurable to operate as a serial shift register in a scan shift mode of operation of the integrated circuit 805 and also to capture functional data from combinational logic elements or other functional logic of the circuitry under test 840 in a functional mode of operation of the integrated circuit 805.

The scan compression circuitry 830 is assumed in the present embodiment to include one or more additional sets of scan chains, not necessarily part of the LBIST circuitry 820, that operate in conjunction with compressed scan testing carried out utilizing external tester 850 and scan compression circuitry 830. Thus, in the embodiment of FIG. 8, the external tester 850 and scan compression circuitry 830 are utilized for compressed scan testing of one or more portions of the circuitry under test 840, and the LBIST circuitry 820 is utilized for scan testing of one or more portions of the circuitry under test 840, where the same portions of the circuitry under test 840 may be targeted by both the scan compression circuitry 830 and LBIST circuitry 820. It should therefore be understood that the LBIST circuitry 820 and scan compression circuitry 830 may both target the same functional logic in the circuitry under test 840. Also, the LBIST circuitry 830 may be controlled at least in part by the external tester 850. The external tester 850 is therefore not limited to use with the scan compression circuitry 830. Again, other embodiments could perform just LBIST testing or just scan compression testing.

The scan compression circuitry 830 is assumed to more particularly comprise a decompressor, a compressor, and a plurality of scan chains arranged in parallel between outputs of the decompressor and inputs of the compressor. The decompressor is configured to receive compressed scan data from the tester 850 and to decompress that scan data to generate scan test input data that is shifted into the scan chains when such chains are configured as respective serial shift registers in a scan shift mode of operation. The compressor is configured to receive scan test output data shifted out of the scan chains, also when such chains are configured as respective serial shift registers in the scan shift mode of operation, and to compress that scan test output data for delivery back to the tester 850.

The number of scan chains utilized by the scan compression circuitry 830 is generally much larger than the number of decompressor inputs or compressor outputs. The ratio of the number of scan chains to the number of decompressor inputs or compressor outputs provides a measure of the degree of scan test pattern compression provided in the scan compression circuitry 830. It should be noted, however, that the number of compressor outputs need not be the same as the number of decompressor inputs.

The tester 850, either external to or internal of the integrated circuit 805, may comprise the test circuitry 560 tester or tester module 150 and/or the test clock generating circuit 140 described above with respect to FIGS. 1 to 6.

The particular configuration of testing system 800 as shown in FIG. 8 is exemplary only, and the testing system 800 in other embodiments may include other elements in addition to or in place of those specifically shown, including one or more elements of a type commonly found in a conventional implementation of such a system. For example, various elements of the tester 850 or other parts of the system 800 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Figure 9:
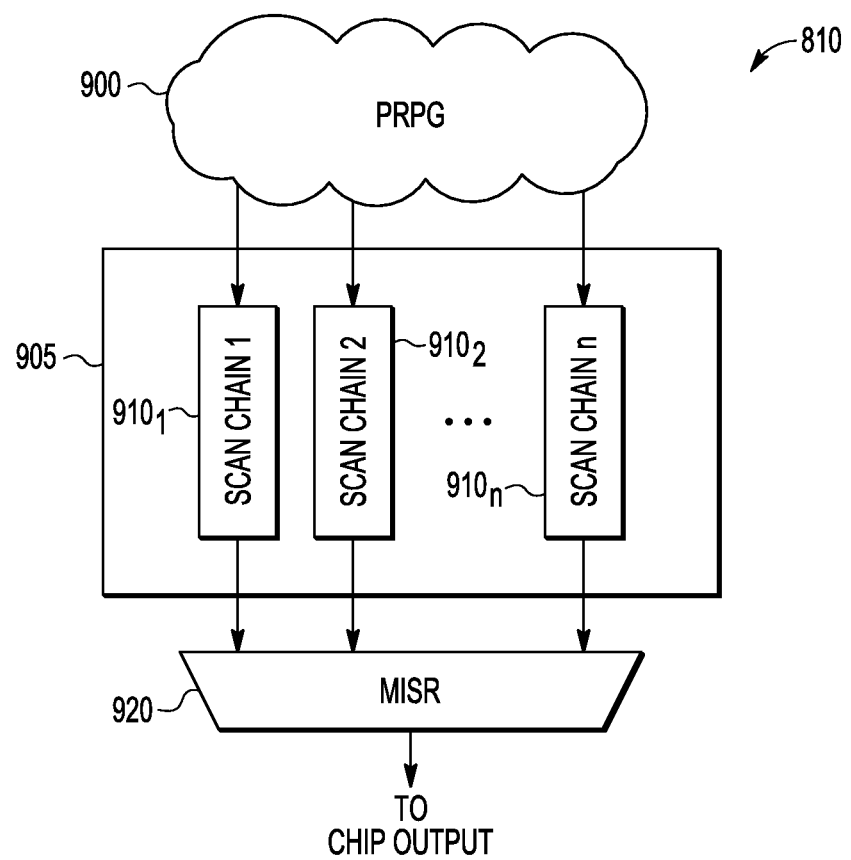
FIG. 9 schematically illustrates a block diagram showing a more detailed view of a portion of the integrated circuit of FIG. 8.

Referring now to FIG. 9, portions of LBIST circuitry 820 are shown in greater detail. In this embodiment, the LBIST circuitry 820 comprises a pseudo random pattern generator (PRPG) 900, a multiple input shift register (MISR) 920, and a plurality of scan chains $910_1$ to $910_k$, where k=1, 2, . . . , K, arranged in parallel between the PRPG 900 and the MISR 920. An output of the MISR 920 is coupled to a designated chip output of the integrated circuit 805.

Like the other scan chains previously described, each of the scan chains 910 comprises a plurality of flip flops 110, and is configurable to operate as a serial shift register in a scan shift mode of operation of the integrated circuit 805 and to capture functional data from circuitry under test 840 in a functional mode of operation of the integrated circuit 805. The scan chains 910 may be associated with multiple distinct clock domains, or a single clock domain. However, it will be assumed for embodiments to be described herein that the scan chains are associated with a single clock domain.

As will be described in greater detail below, the scan chains 910 are configured to prevent capture of potentially non-deterministic values from portions of the circuitry under test 840. Other scan chains of the scan test circuitry 810, such as those that are part of or otherwise associated with the scan compression circuitry 830, are also assumed to be configured in a similar manner, so as to prevent capture of potentially non-deterministic values from other portions of the circuitry under test 840.

The first scan chain $910_1$ is of length n, and therefore comprises $n_1$ flip flops. More generally, scan chain $204_k$ is of length $n_k$ and therefore comprises a total of $n_k$ flip flops. In some embodiments of the invention, the lengths of the scan chains 910 are balanced so that the same amount of time is needed to shift the desired set of scan test patterns into all of the scan chains. It may therefore be assumed without limitation that all of the scan chains 910 are of the same length n, such that $n_1=n_2= \ldots =n_k=n$.

The circuitry under test 840 in this embodiment may comprise a plurality of logic blocks separated from one another by the scan chains 910. Such logic blocks may be viewed as examples of what are more generally referred to as "additional circuitry" that is subject to testing utilizing scan test circuitry in embodiments of the invention. By way of example, such internal circuitry blocks of integrated circuit 805 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

A given test pattern applied to the scan chains 910 in the present embodiment may be viewed as a scan vector, where a scan vector comprises a shift-in phase in which scan test input data is shifted into all of the scan chains 910, followed by a capture phase in which functional data is captured, followed by a shift-out phase in which scan test output data is shifted out from all of the scan chains 910. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern. Other types of shift modes or phases can be used.

In the foregoing specification, the invention has been described with reference to specific examples of embodiments of the invention. It will be evident, however, that various modifications and changes may be made therein without departing from the broader spirit and scope of the invention as set forth in the appended claims.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It will be further understood that the terms "comprises", "comprising", "includes" and/or "including", The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to distinguish arbitrarily between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. An integrated circuit comprising:
   a scan chain having a first plurality of dual edge flip flops and a second plurality of dual edge flip flops, wherein each dual edge flip flop of the first and second pluralities of dual edge flip flops includes a data input, a scan input, a clock input, and data output, the scan chain to receive a test pattern at the scan input that is synchronous with a test clock during a shift phase of scan testing;
   a clock divider circuit coupled to receive the test clock and configured to divide the test clock to provide a divided test clock having a lower frequency than the test clock;
   clock selection circuitry having a first input coupled to receive the divided test clock, a second input coupled to receive a system clock, a control input coupled to receive a scan enable signal, and an output coupled to provide one of the divided test clock and the system clock as a clock signal to the clock input of the scan chain based on the scan enable signal, wherein the divided test clock is provided to the clock input of the scan chain during the shift phase of scan testing; and
   second clock selection circuitry having a first input coupled to receive the divided test clock, a second input coupled to receive a second system dock, a control input coupled to receive the scan enable signal, and an output configured to provide the divided test clock as a second clock signal to the clock input of each dual edge flip flop of the second plurality of dual edge flip flops when the scan enable signal has the first value, and to provide the second system clock as the clock signal to the clock input of each dual edge flip flop of the second plurality of dual edge flip flops when the scan enable signal has the second value wherein the second system clock is 90 degrees out of phase with the system clock.

2. The integrated circuit of claim 1, wherein each dual edge flip flop includes a control input configured to receive the scan enable signal, wherein each dual edge flip flop is configured to latch a value in response to the clock signal at one of the scan input or the data input based on the scan enable signal.

3. The integrated circuit of claim 2, wherein each dual edge flip flop is configured to latch a value at the one of the scan input or the data input in response to each of a rising edge and a falling edge of the clock signal.

4. The integrated circuit of claim 3, wherein each dual edge flip flop comprises a first latch and a second latch coupled in parallel with the first latch, wherein each dual edge flip flop is configured to provide an output value at the data output from the first latch during a first phase of a clock cycle of the clock signal and from the second latch during a second phase of the clock cycle of the clock signal.

5. The integrated circuit of claim 1, wherein the clock selection circuitry is configured to provide the divided test clock as the clock signal when the scan enable signal is asserted and to provide the system clock as the clock signal when the scan enable signal is negated.

6. The integrated circuit of claim 5, each dual edge flip flop is configured to select the scan input when the scan enable signal is asserted and select the data input when the scan enable signal is negated.

7. The integrated circuit of claim 6, wherein when the scan enable signal is asserted, the scan chain is configured to shift in a scan test pattern, and when the scan enable signal is negated, the scan chain is configured to operate in a functional mode.

8. The integrated circuit of claim 1, wherein the test clock is received from an external tester.

9. The integrated circuit of claim 1, wherein the clock divider circuit provides the divided test clock with a frequency that is half a frequency of the test clock.

10. The integrated circuit of claim 1, wherein a scan input of a first dual edge flip flop of the plurality of dual edge flip flops is coupled to a data output of a second dual edge flip flop of the plurality of dual edge flip flops and a data input of the first dual edge flip flop is coupled to an output of combinational logic.

11. A method for scan testing in an integrated circuit having first scan chain having a first plurality of dual edge flip flops and a second scan chain having a second plurality of dual edge flip flops, the method comprising:
    receiving a test clock;
    dividing the test clock to generate a divided test clock having a lower frequency than the test clock;
    receiving, at a scan input of each dual edge flip flop, of the first plurality of dual edge flip flops, a test pattern that is synchronous with the test clock during a shift phase of scan testing;
    providing the divided test clock to a clock input of each dual edge flip flop of the first scan chain during the shift phase of scan testing;
    providing a system clock to the clock input of each dual edge flip flop of the scan chain during a capture phase of scan testing;
    providing the divided test clock to a clock input of each dual edge flip flop of the second plurality of dual edge flip flops during a shift phase of scan testing;
    providing a second system clock to the clock input of each dual edge flip flop of the second plurality of dual edge flip flops during the capture phase of scan testing, wherein the second system clock is 90 degrees out of phase with the system clock; and
    during the capture phase, latching values output by combinational logic at a data input of each dual edge flip flop of the second plurality of dual edge flip flops in response to both rising and falling edges of the second system clock.

12. The method of claim 11, further comprising:
    during the shift phase, shifting bits of a test pattern into scan inputs of the dual edge flops of the scan chain in response to both rising and falling edges of the divided test clock.

13. The method of claim 12, further comprising:
    receiving the test clock from a tester; and
    receiving the test pattern from the tester, wherein bits of the test pattern received from the tester are aligned to one of falling edges or rising edges of the test clock.

14. The method of claim 12, further comprising:
    during the capture phase, latching values output by combinational logic at a data input of each dual edge flip flop of the first plurality of dual edge flip flops in response to both rising and falling edges of the system clock.

15. The method of claim 12, wherein dividing the test clock to generate the divided test clock is performed such that the divided test clock has a frequency that is half of a frequency of the test clock.

16. An integrated circuit comprising:
    a scan chain having a first plurality of dual edge flip flops and a second plurality of dual edge flip flops, wherein each dual edge flip flop includes a data input, a scan input, a clock input configured to receive a clock signal, a control input configured to receive a scan enable signal, and a data output, wherein each dual edge flip flop of the first plurality of dual edge flip flops is configured to latch a test pattern bit at the scan input in response to the clock signal when the scan enable signal has a first value and latch a data bit from combinational logic at the data input in response to the clock signal when the scan enable signal has a second value, the scan chain to receive a test pattern at the scan input that is synchronous with a test clock when the scan enable signal has the first value,
    each dual edge flip flop of the second plurality of dual edge flip flops includes a data input, a scan input, a clock input configured to receive a second clock signal, a control input configured to receive the scan enable signal, and a data output, wherein each the dual edge flip of the second plurality of dual edge flip flops is configured to latch a test pattern bit at the scan input in response to a second clock signal when the scan enable signal has the first value and latch a data bit from combinational logic at the data input in response to the second clock signal when the scan enable signal has the second value;
    a clock divider circuit coupled to receive the test clock and configured to divide the test clock to provide a divided test clock having a lower frequency than the test clock;
    first clock selection circuitry having a first input coupled to receive the divided test clock, a second input coupled to receive a system clock, a control input coupled to receive a scan enable signal, and an output configured to provide the divided test clock as the clock signal when the scan enable signal has the first value and to provide the system clock as the clock signal when the scan enable signal has the second value, wherein the divided test clock is provided to the clock input of the scan chain when the scan enable signal has the first value; and
    second clock selection circuitry having a first input coupled to receive the divided test clock, a second input coupled to receive a second system clock, a control input coupled to receive the scan enable signal, and an output configured to provide the divided test clock as the second clock signal when the scan enable signal has the first value and to provide the second system clock as the clock signal when the scan enable signal has the second value, wherein the second system clock is 90 degrees out of phase with the system clock.

17. The integrated circuit of claim 16, wherein each dual edge flip flop is configured to latch test pattern bits in response to rising and falling edges of the clock signal when the scan enable signal has the first value and latch data bits in response to rising and failing edges of the clock signal when the scan enable signal has the second value.

18. The integrated circuit of claim 16, wherein the scan enable signal has the first value during a shift phase of scan testing and has the second value during a capture phase of scan testing and during a functional mode of the integrated circuit.

* * * * *